United States Patent
Fromson et al.

(10) Patent No.: US 6,905,267 B1
(45) Date of Patent: Jun. 14, 2005

(54) METHOD FOR REDUCING CONSUMPTION OF PLATE PROCESSING FLUID

(75) Inventors: Howard A. Fromson, Stonington, CT (US); William J. Rozell, Vernon, CT (US)

(73) Assignee: Anocoil Corporation, Rockville, CT (US)

( * ) Notice: Subject to any disclaimer, the term of this patent is extended or adjusted under 35 U.S.C. 154(b) by 0 days.

(21) Appl. No.: 10/929,972

(22) Filed: Aug. 30, 2004

(51) Int. Cl.[7] .......................... G03D 5/00; B05C 11/00
(52) U.S. Cl. ................ 396/604; 396/611; 396/606; 396/627; 355/100; 118/52; 118/677
(58) Field of Search .................. 396/604, 606, 396/611, 627; 355/27–29, 100; 118/52, 677

(56) References Cited

U.S. PATENT DOCUMENTS

| | | | | |
|---|---|---|---|---|
| 3,981,583 A | * | 9/1976 | Tsuchida et al. ............. | 355/100 |
| 4,708,452 A | * | 11/1987 | Schoen ......................... | 396/611 |
| 4,841,320 A | * | 6/1989 | Takekoshi et al. ........... | 396/604 |
| 5,489,337 A | * | 2/1996 | Nomura et al. .............. | 118/677 |

* cited by examiner

Primary Examiner—D. Rutledge
(74) Attorney, Agent, or Firm—Alix, Tale & Ristas, LLP

(57) ABSTRACT

Disclosed herein are a method and apparatus for efficiently processing workpieces which are developed using a liquid developer. According to the invention a first set of workpieces is obtained from an imaging station, a second set of workpieces is obtained from a workpiece collection device, and the workpieces from the first and second sets are aligned in a contiguous arrangement, with the workpieces from the first set preferably being interspersed with those from the second set. Developer is then applied to the group of contiguous workpieces, thereby reducing the amount of overrun or overspray of developer that would otherwise result from individual processing of workpieces. The invention is particularly well-suited for use in preparing lithographic printing plates.

30 Claims, 4 Drawing Sheets

METHOD FOR REDUCING CONSUMPTION OF PLATE PROCESSING FLUID

BACKGROUND OF THE INVENTION

The present invention is directed to a method and apparatus for reducing the consumption of plate processing fluid and more particularly to a method and apparatus for reducing consumption of solutions used to develop imaged workpieces.

In the process for preparing lithographic printing plates which is described in U.S. Published Application 2003/0072575A1, the plates are imaged in an imaging station and are then fed directly to a processing station where a liquid developer is applied. In the processing station, the plates are transported by a conveyor past an applicator which applies a thin film of developer solution generally uniformly over the surface of each imaged plate. This thin film of developer is allowed to dwell on the plate for a time sufficient to complete the development, and is then rinsed from the plate.

In an automated line in which plates are imaged and then developed, the time required for imaging typically is the throughput limiting step in the process. Thus in a continuous process, the developing station has a period of inactivity after a particular plate is processed and before the subsequent plate is processed. It would be useful to develop an automated method and apparatus for preparing lithographic printing plates or other workpieces having improved efficiency.

When lithographic printing plates are individually conveyed through a developing station, in order to ensure that all of the imaged portion of each plate is contacted with developer there is some overspray or overrun of developer onto the conveyor on each of the four sides of the plate. This developer is usually not recovered and therefore goes to waste. It would be useful to devise a method of applying developer to the plates in which the quantity of wasted developer is reduced.

SUMMARY OF THE INVENTION

An object of the invention is to provide an apparatus and method for efficiently developing imaged workpieces.

Another object of the invention is to provide a method of reducing waste of a processing fluid which is applied to workpieces as a liquid film.

A further object is to provide a method of reducing the quantity of processing fluid required for developing lithographic printing plates.

Yet another object is to provide an apparatus and method for efficiently imaging and developing lithographic printing plates when a single line is used for imaging and developing.

Other objects of the invention will be in part obvious and in part pointed out in more detail hereafter.

The invention in a preferred form is a method of processing imaged workpieces for development comprising the steps of: obtaining a first set of imaged workpieces directly from an imaging station, obtaining a second set of workpieces from an imaged workplece collection device, aligning the workpieces from the first set with the workpieces from the second set in a contiguous arrangement to form a group of contiguous workpieces, and applying a developing solution to the group of contiguous workpieces. Preferably, the workpieces in the first set are continuously conveyed in spaced apart relation from the imaging station to the developing station where developer is applied. The workpieces from the second set typically are interspersed with the workpieces from the first set in the alignment step. The workpieces are then conveyed together as a group to the developing station. Alternatively, the workpieces from the second set can be positioned adjacent the workpieces from the first set in the alignment step.

In one preferred form of the invention, the imaged workpiece collection device is associated with the imaging station. Alternatively, the imaged workpiece collection device can be associated with a supplemental imaging station.

The developer typically is applied using a wire-wound coating device, or can be applied using a spraying or jetting device. The workpieces preferably are rectangular and usually are lithographic printing plates. Usually, the contiguous group of workpieces includes at least six workpieces. The workpieces preferably are rectangular plates having leading and trailing edges relative to the direction of conveyance and step (d) of applying a developer solution includes applying developer solution outside the leading and trailing edges. In a preferred form of the invention, for each group of plates, the volume of developer applied outside the leading and trailing edges is less than 15%, and more preferably less than 10%, of the developer volume applied to the group.

Another preferred form of the invention is a method of reducing the quantity of solution required for processing lithographic printing plates in an automated process, comprising the step of contiguously arranging the plates head-to-tail in groups having at least six workpieces per group prior to application of the solution in order to reduce leading and trailing edge losses of the solution. Each group of plates typically includes a first set of plates received directly from an imaging station and a second set of plates received from an imaged plate stockpile. Preferably the plates from the second set are interspersed with the plates from the first set.

A further form of the invention is a method of delivering lithographic printing plates to a developing station comprising the steps of: obtaining a first set of plates from an imaging station, obtaining a second set of plates from an imaged plate stockpile, interspersing the plates from the first set with the plates from the second set, aligning the interspersed plates in a contiguous arrangement, and conveying the aligned plates to a developing station.

Another preferred form of the invention is an apparatus for processing imaged workpieces comprising: an imaging station, a developing station, a workpiece collection device positioned between the imaging station and the developing station for storing imaged workpieces, alignment means positioned between the imaging station and the developing station for aligning workpieces departing from the imaging station with workpieces departing from the workpiece collection device in a contiguous arrangement to form a group of contiguous workpieces, and means for conveying the group of contiguous workpieces to the developing station. The alignment means preferably includes means for interspersing workpieces departing from the imaging station with workpieces departing from the workpiece collection device. The developing station typically includes a wire-wound applicator for applying a developer solution to the workpieces. The wire-wound applicator preferably comprises a horizontal wire-wound tube, a hollow tube positioned above or within the wire-wound tube having a plurality of apertures along the length on one side thereof, and means for feeding the developer solution into the hollow tube whereby the developer solution overflows from the hollow tube through the plurality of apertures and flows down the hollow tube onto the wire-wound tube.

Another preferred form of the invention is an apparatus for delivering lithographic printing plates to a developing station comprising: means for receiving a first set of plates from an imaging station, collection means for collecting a second set of plates, means for interspersing the plates from the first set with the plates from the second set, alignment means for aligning the interspersed plates in a contiguous arrangement, and means for conveying the aligned plates to the developing station. The collection means preferably is configured to collect the second set of plates from the imaging station.

The invention accordingly comprises the several steps and the relation of one or more of such steps with respect to each of the others and the apparatus possessing the features, properties and relation of elements exemplified in the following detailed disclosure.

DESCRIPTION OF THE PREFERRED EMBODIMENTS

Figure 1:
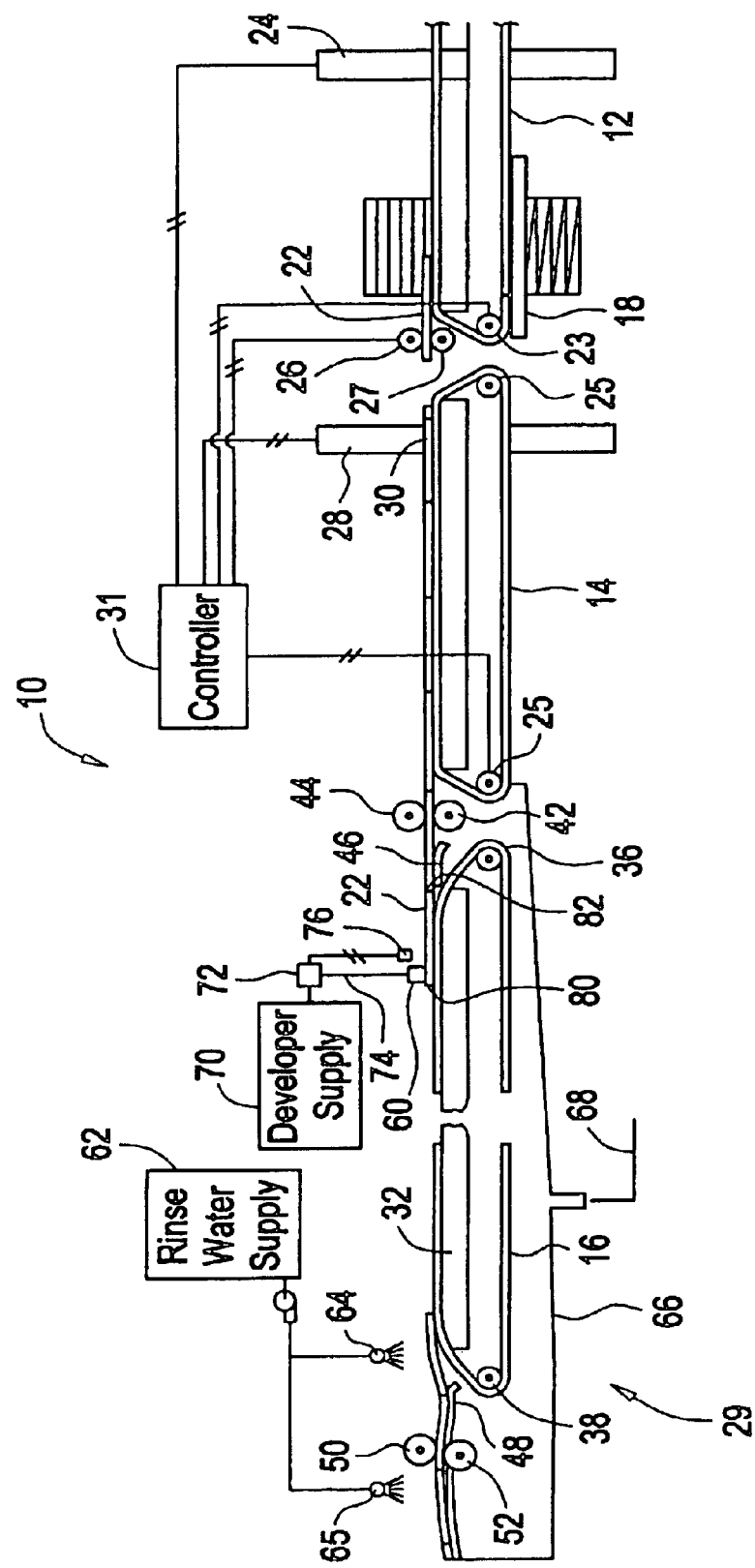
FIG. 1 is a general diagrammatic sketch of a conveyor assembly and developer apparatus for use in practicing the invention.
Figure 2:
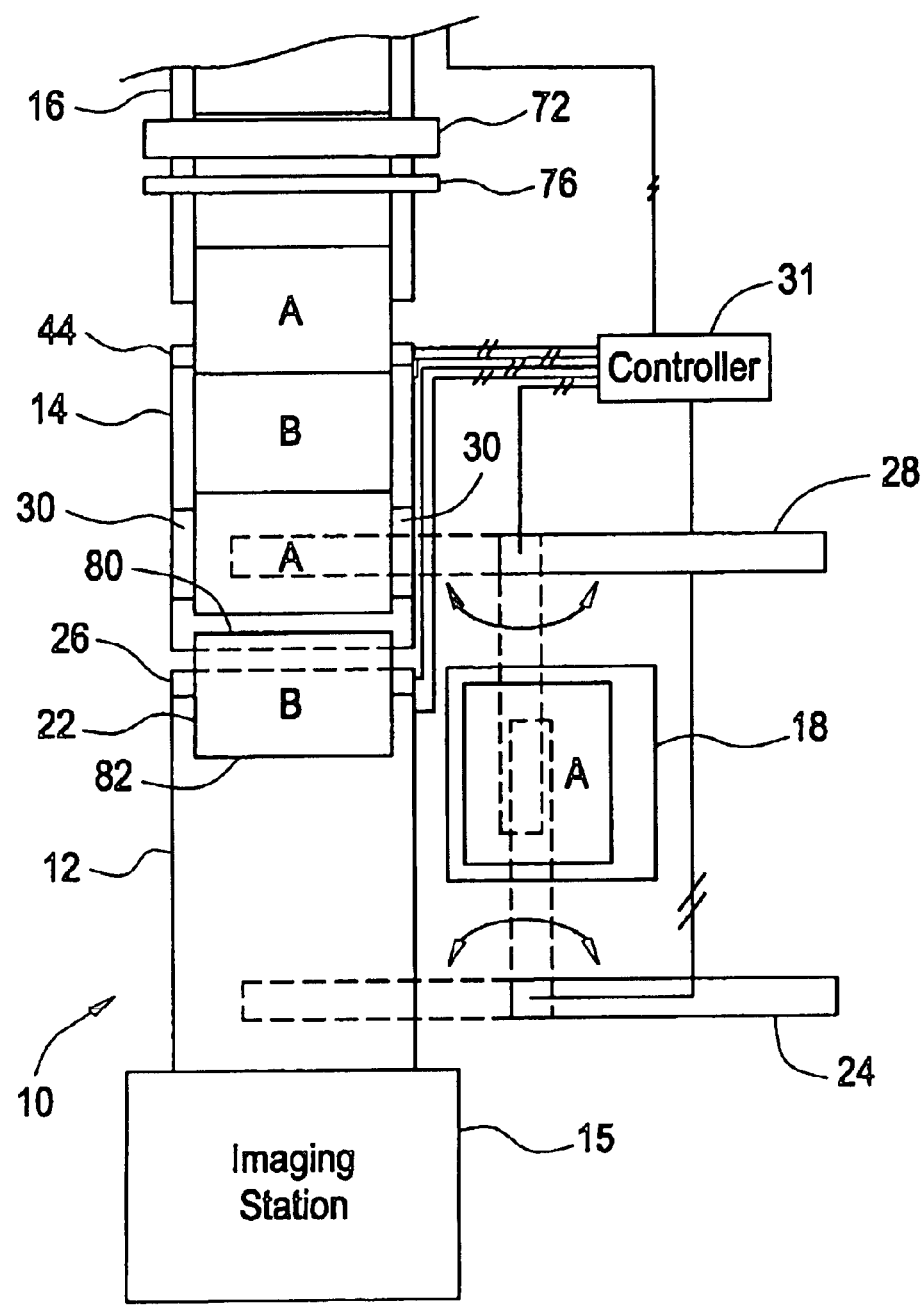
FIG. 2 is a schematic drawing showing the incorporation of accumulated imaged plates into a line of plates departing from the imaging station.

FIGS. 1 and 2 illustrate the general arrangement of the preferred equipment for practicing the invention. While the invention can be used to process various kinds of workpieces, the preferred embodiment refers to equipment used for processing lithographic printing plates.

The workpiece processing apparatus of the invention, generally designated as 10, employs a conveyor system which includes an imager output conveyor 12, a workplece realignment conveyor 14, and a developer conveyor 16 arranged in series. A workpiece collection platform 18 is positioned at the downstream end of the imager output conveyor 12 and/or the upstream end of the workpiece realignment conveyor 14. Each conveyor has a substantially flat support surface to support horizontally positioned, flat workpieces, such as lithographic printing plates 22. The second set of plates, which preferably but not necessarily have been consecutively imaged in the imaging station 15 of the apparatus (each plate in this set is designated as A in FIG. 2), is transferred from the imager output conveyor 12, which is driven by drive rollers 23, to the workpiece collection platform 18 using a suitable plate transfer device 24, such as a pivotable plate suction device. After the desired number of plates have been collected, a first set of plates, with each plate being designated as B, is conveyed consecutively and directly from the imager output conveyor 12 through a pair of realignment conveyor feed rollers 26, 27 to the workpiece realignment conveyor 14, which is driven by rollers 25. While the first set of plates is being conveyed in spaced apart relation along the workpiece realignment conveyor 14, plates A from the second set are lifted from the workpiece collection platform 18 using a plate replacement device 28, which can be a pivotable plate suction device or another suitable apparatus, and are positioned between plates B from the first set. The intermixed plates from the first and second sets of plates are positioned contiguously head-to-tail using a plate positioning device 30. Controller 31 is programmed to control the speed of conveyor rollers 23 and 25 and feed rollers 26, 27, 42 and 44. Controller 31 also controls the vertical and horizontally pivotable movement of plate transfer device 24 and plate replacement device 28.

Once aligned, the plates 22 from both sets A and B form a group that is fed to a developing station 29 for processing with a developer solution.

As used herein, the terms "contiguous" and "contiguously" mean that the gap between two adjacent workpieces in a group entering the developer is no more than 10% of the workpiece dimension in the conveying direction, and more preferably is no more than 5% of the workpiece dimension in the conveying direction. Most preferably, the plates in a particular group are directly adjacent to one another with no appreciable gap therebetween.

In the developing station, the imaged plates 22 are carried across a platen 32 by means of a conveyor system which comprises the conveyor drive rollers 36 and 38 and the developer conveyor 16. The developer conveyor 16 is composed of a material which will be unaffected by the developer solution, such as stainless steel or a polymer material. The plates 22 are fed by the feed rollers 42 and 44 onto the feed platform 46 which directs the printing plates 22 onto the developer conveyor 16 for transport across the platen 32. After processing, the printing plate is guided by the discharge platform 48 into a pair of discharge rollers 50 and 52. Although the flat platen is the preferred support structure, other supports can be employed for the conveyor belt. For example, the support structure could be a series of rollers which have a small diameter and are closely spaced such that they provide adequate support to maintain a flat conveyor belt.

The printing plates 22 as delivered to the developer have been imaged by any process which selectively changes the solubility of the coating. Typical imaging methods include exposure to radiation and writing by ink jet. As is well known in the art, the imaging process renders the coating soluble in the imaged areas of a positive working plate and renders the coating insoluble in the imaged areas of a negative working plate. In either case, it is the coating which has been rendered soluble or the coating which has remained soluble that is removed in the development process of the present invention. The particular compositions of the developer solutions for these different types of printing plates are well known. For example, many of the printing plates currently in use have coatings that contain alkali-soluble resins. These coatings usually contain dissolution inhibitors that render them insoluble in the alkaline developers. The imaging process reverses this dissolution inhibition and the coating then becomes soluble in the areas subjected to the imaging radiation.

In the developing zone, at the beginning of the travel of the printing plate across the platen 32, the developer solution is applied to the printing plate using an applicator 60. The applicator can be any suitable device for applying developer, and preferably is a device which applies the precise thickness of developer that is required, as compared to devices that apply excess developer which is subsequently removed with a roller or the like.

A developer supply drum 70 supplies developer to the applicator 60 through a developer feed line 74. Flow of developer is controlled by a flow control device 72, which typically is a pump or control valve. A plate sensor 76 detects the presence of a plate 22 and actuates the flow control device 72 in response to a signal from the plate sensor 76.

The printing plate which has been coated with the developer solution continues to travel across the platen. The length and speed of travel is selected such that the developer solution will have completed the development process by the time the printing plate reaches the discharge end of the platen. A typical development time is 30 seconds.

At this point, rinse water from the supply 62 is sprayed onto the plate through the spray nozzles 64 and 65. Located below the conveyor structure is a collection pan 66 which collects all of the liquid run-off from the printing plate including any excess developer solution and the spent developer solution and rinse water now containing the portion of the coating which has been dissolved away. The developer solution which is rinsed from the plate is collected at a collection pan outlet 68 and preferably sent to waste. In that case, it can be seen that there is fresh developer solution being applied to the plates and that there is only a small quantity of developer solution applied to each plate. As an option, the dissolved coating may be vacuumed from the plate.

From the rinse section of the developer, the plate is fed across the platform 48 and into the feed rollers 50 and 52 and delivered to a finishing section where the developed and rinsed plate is treated in any conventional manner such as with gum arabic. Following the finishing section there may be a dryer.

To assure that the plates 22 will develop properly, it is necessary to initiate the delivery of developer ahead of the leading edge of the plate. In a conventional developing station, in which plates are spaced apart from one another, some developer is wasted as it is deposited upstream from the leading edge 80 of the plate. Similarly, as the trailing edge 82 of the plate exits from the coating region, there is still some developing solution on the applicator 60, and this remaining developer wasted when it is deposited on the developing conveyor behind the trailing edge 82 of the plate. When a spray nozzle is used, it is necessary to have some degree of overspray on all four sides of the plate to ensure that the plate edges are thoroughly coated. For smaller plates, the percentage of wasted developer is higher than that for larger plates.

The present invention substantially reduces waste along the leading and trailing ends of individual plates since such losses only occur before the first plate in a group and after the last plate in the group. For example, when ten plates are aligned contiguously, and the combined loss of developer along both the leading and trailing edge of a single, individual plate amounts to 20 wt % of the total quantity of developer, the loss of developer is reduced to only 20%/10 or 2% per plate. Further savings can be achieved if the groups of contiguous plates contain more than ten plates per group.

Figure 3:
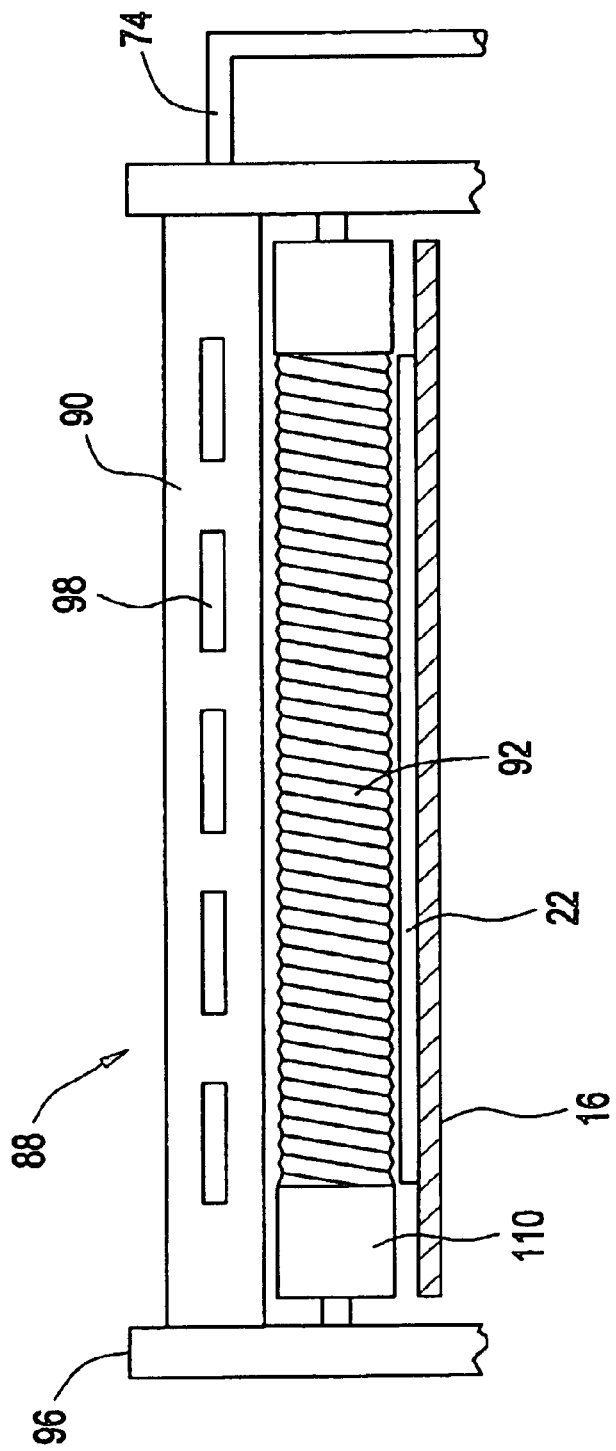
FIG. 3 illustrates one embodiment of a wire-wound coater which can be used to spread fluid on a workpiece in accordance with the invention.
Figure 4:
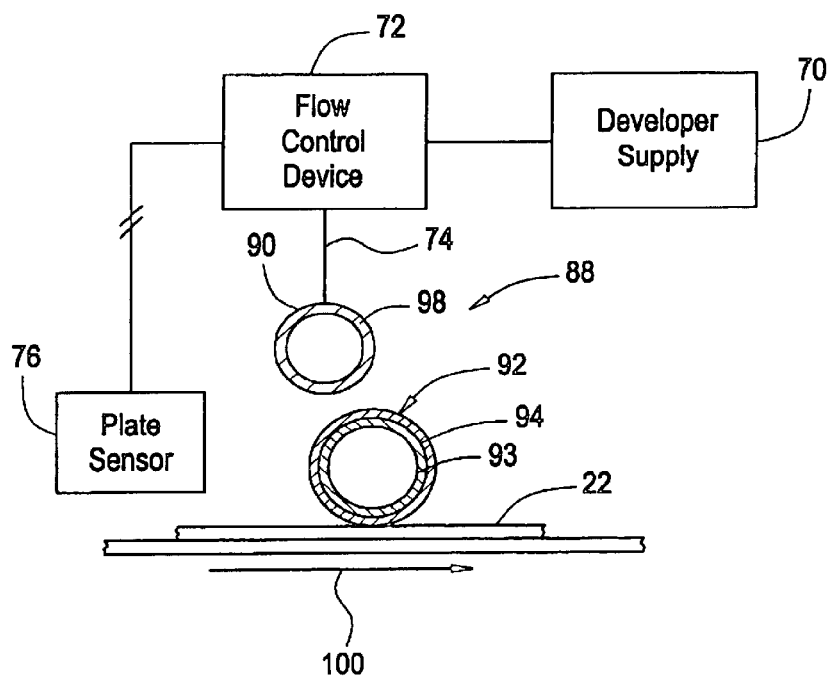
FIG. 4 is a schematic drawing showing a cross section of the wire-wound coater of FIG. 3 in conjunction with a system for delivering developer solution.

One embodiment of an applicator 60 that can be used in the invention is a wire-wound coater, such as a conventional Mayer rod, or a modified Mayer rod having a developer delivery system incorporated therein. In a particularly preferred form of the invention, the coater 88 includes a fluid supply tube 90 mounted above a wire-wound device 92, as is shown in FIGS. 3 and 4. The wire-wound device 92 preferably is a typical wire-wound rod containing a core 93, which can be solid or hollow, which is wound with the wire 94. The exposed surface of the wire 94 preferably is coated with a low surface energy (non-stick) material, such as polytetrafluoroethylene (PTFE). Typically, the device 92 is mounted in a frame 96 and can be mounted to rotate if desired. In applications where the fluid is a low viscosity fluid and the film thickness is small, it is particularly advantageous to match the circumferential surface speed of the wire-wound rod to the conveyor belt speed to reduce any tendency of the wire-wound rod to scratch the surface of the plate. The fluid supply tube 90, which may be cylindrical in cross section, as illustrated, or can have any other desired cross-sectional configuration, is provided with slots 98 or holes along its length. Based upon a signal from the plate sensor 76, fluid from the developer supply drum 70 is supplied to the fluid supply tube 90 through the developer feed line 74, and under the control of the flow control device 72, the fluid overflows out through the slots 98. The fluid supply tube 90 is mounted above the wire-wound device 92 such that the fluid will run down the fluid supply tube 90 and flow onto the wound wire 94 on the device 92 on the upstream side of the coater 88. This is shown in FIG. 4 where the arrow 100 shows the direction of movement of the conveyor 16 and plate 22 and the tube 90 is located slightly upstream from the device 92. This assures that all of the fluid fed onto the plate is subjected to the action of the wire-wound rod and does not run down onto the plate on the downstream side of the rod.

In another embodiment, the developer solution is fed from a supply tank to one or more spray nozzles which are appropriately designed and located to spread the developer solution generally uniformly over the surface of the printing plate as it is being conveyed. The developer solution is then spread by a conventional wire-wound rod coater, such as a Mayer Rod. The quantity of developer solution needed is generally only that quantity needed to form a thin film of developer solution generally 2 to 10 mils thick. However, the specific quantity needed will vary and be determined by the particular nature of the coating to be dissolved and the nature of the developer solution.

In a further embodiment, the wire-wound coater has holes or slots along its length, and the developer is delivered into the interior of a hollow tube positioned within the coater in order that it overflows out through the holes onto the wire wound rod. The rod then distributes the developer across the plate to ensure uniform plate coverage. The volume can be controlled using a peristaltic pump that feeds the correct amount of fluid to the plate. Alternately, the fluid can be gravity fed. Merely as an example, these slots may be 1/16 inch wide by ½ inch long with 1 inch between slots. Small holes are formed through the layer of wire between adjacent wraps of the wire with these holes lining up with the slots. The developer is fed to the inside of the hollow tube from a supply drum through the flexible tube which goes through the preferred peristaltic pump. The developer exits through the slots and holes and runs down over the wire-wound rod onto the plate. In general, the thickness of the fluid applied is equal to about 9% or 10% of the diameter of the wire on the rod. Other non-limiting examples of suitable wire-wound coaters are shown in commonly assigned U.S. application Ser. No. 10/446,357 filed May 28, 2003.

Conventional Mayer-Rod coaters are wire-wound the full length of the rod. However, the coater shown in FIG. 3 is only wire-wound for a length generally corresponding to the width of the printing plates 22. The two end sections 110 of the coater are enlarged and have a diameter at least equal to the outside diameter of the wound wire 94. The enlarged portions may either be enlarged sections of the shaft itself or they may be sleeves which are carried by reduced sections on the ends of the shaft. These sleeves may be resilient. One particular arrangement is to have the radius of the enlarged end sections be larger than the radius of the outside of the wound wire 94 by an amount up to the thickness of the plate. By having the wound wire 94 extend only the width of the printing plate being developed and having the enlarged/solid ends, the wound wire 94 is prevented from carrying developer the full width of the conveyor belt. That would require considerably more developer solution than would be required for a printing plate having a width considerably less than the width of the conveyor belt. A series of Mayer-Rod coaters can be stocked for developing different width plates and the appropriate one would merely be dropped into the mounting slots. Alternatively, the fluid supply tube 90 can be configured to permit the flow of developer through selected slots 98 depending upon the width of the plate 22.

In the context of the present invention, the term "wire-wound" includes what are termed "formed rods". These formed rods are manufactured by machining a rod or tube to produce a rolled thread-like profile that duplicates the pitch and radius of the rods formed by winding wire and are to be understood to be the equivalent of rods formed by winding wire onto a core.

In the embodiment shown in FIGS. 3 and 4, a peristaltic pump preferably is used as the means for delivering the developer to the fluid supply tube 90. The pump commences operation when the leading edge of the plate is detected by the sensor 76. The volume of developer delivered by the peristaltic pump causes an equal volume of developer to overflow through the slots or holes out onto the wire, where it is distributed across the plate width. The pump rate is matched to the plate speed and developer quantity requirement to maintain a uniform coverage along the length of the plate. The pump stops in conjunction with the sensing of the trailing edge of the plate.

In yet another embodiment, a jetting printhead is used for metering and feeding developer solution to a plate to control the thickness and assure the uniformity of the developer solution on the plate. A jetting printhead can be mounted on a track for movement back and forth across a plate in a raster or scan pattern as is well known in the inkjet printer technology. Alternatively, a wide stationary printhead can be fixed to a stationary support frame on each side of the developer conveyor. The printhead typically has a length corresponding to the width of the conveyor. In place of a single, wide printhead, two, three, four or more smaller printheads can be arranged generally side by side to extend across the width of the conveyor. The printhead has jetting nozzles along substantially its entire length. Control means provide for the ejection of the developer through selected nozzles in response to input from sensors which detect the presence of, and the dimensions of, the plates. The use of a wide printhead provides for rapid and precise jetting of developer onto printing plates. Application of developer using a jetting printhead is described in further detail in commonly assigned U.S. application Ser. No. 10/783,759 filed Feb. 20, 2004, the contents of which are incorporated herein by reference.

COMPARATIVE EXAMPLE 1

Ten plates are individually imaged and developed in a conventional automated process in which each plate spends 60 seconds in the imaging station and 90 seconds in the developing station. The imager conveyor operates at a throughput speed of 2 feet per minute. The developer conveyor operates at a throughput speed of 4 feet per minute and has a length of four feet. The plates are spaced about 2 feet apart in the developer. Because the developing station is set up to receive plates from an imaging station, a new plate arrives at the developing station every 60 seconds. Each plate is a 1 ft. by 2 ft. rectangle.

In the first minute, plate #1 is imaged. In the second minute, plate #1 enters the developing station while plate #2 is imaged. This process continues for a total of 12½ minutes, at which time all ten plates have been imaged and developed. The imaging station operates for a total of 10 minutes and the developing station operates for a total of 11½ minutes. Operation of the developing station begins one minute after operation of the imaging station commences. In the tenth minute, plate #10 is imaged. The leading edge of plate #10 enters the developing station at 11 minutes and the trailing edge enters the developing station at 11½ minutes. The leading edge of plate #10 exits the developing station at 12 minutes and the trailing edge exits at 12½ minutes.

Thirty milliliters of developer are consumed per plate, with leading and trailing edge losses of 6 ml each, resulting in a total developer requirement of 42 ml per plate. Total developer consumption is 420 ml. The cost of developer for 500,000 plates per year at $5 per liter is $105,000, with about 29% or $30,450 worth of the developer being wasted at the leading and trailing edges of the plates.

EXAMPLE 1

Ten plates are imaged and processed using the plate preparation apparatus shown In FIG. 1. In the first minute, plate #A1 is imaged. In the second minute, plate #A2 is imaged while plate #A1 is transferred to a hold stack. In the third minute, plate #A3 is imaged while plate #A2 is placed on (or under) plate #A1 in the hold stack. This procedure continues for an additional 3½ minutes, until plate #s A1–A5 are imaged and in the hold stack and a total of 6½ minutes have elapsed. The imager conveyor operates at a throughput speed of 2 feet per minute. During this time, the developing station is not operating.

Plates from the hold stack are then interspersed with "B" plates exiting the imager such that one plate enters the developer for processing every 30 seconds. Total processing time per plate is 90 seconds. Each plate has a throughput speed of 4 feet per minute. When the plates are interspersed, they are aligned head-to-toe in a contiguous arrangement in order that developer solution can be applied continuously along the length of all ten plates, thus eliminating the deposit of excess developer along all of the leading and trailing edges of the plates except for the leading edge of plate #1 and the trailing edge of plate #10. Table 1 summarizes the imaging and processing times for plates 1–10.

TABLE 1

| Minute | Activity |
| --- | --- |
| 1 | Image Plate #A1 |
| 2 | Image Plate #A2, send plate #A1 to hold stack |
| 3 | Image Plate #A3, send plate #A2 to hold stack |
| 4 | Image Plate #A4, send plate #A3 to hold stack |
| 5 | Image Plate #A5, send plate #A4 to hold stack |
| 6 | Image Plate #B6, send plate #A5 to hold stack |
| 6:30 | Send Plate #A5 from hold stack to processor, and begin processing |
| 7 | Image Plate #B7, begin processing of plate #B6 |
| 7:30 | Send Plate #A4 from hold stack to processor, and begin processing |
| 8 | Image plate #B8, begin processing of plate #B7 |
| 8:30 | Send Plate #A3 from hold stack to processor, and begin processing |

TABLE 1-continued

| Minute | Activity |
| --- | --- |
| 9 | Image plate #B9, begin processing of plate #B8 |
| 9:30 | Send Plate #A2 from hold stack to processor, and begin processing |
| 10 | Image plate #B10, and begin processing of plate #B9 |
| 10:30 | Send Plate #A1 from hold stack to processor and begin processing |
| 11 | Begin processing of plate #B10; processing concludes at 12:30 |

Thus, the order of plate development is A5, B6, A4, B7, A3, B8, A2, B9, A1, B10. Total developer consumption is (30 ml/plate×10 plates)+6 ml+6 ml=312 ml for 10 plates or an average of 31.2 ml per plate. This results in only 4% of the developer being wasted. The cost of developer for 500,000 plates per year at $5 per liter is $78,000, resulting in a savings of $27,000 per year over the process of Comparative Example 1. The total processing time for ten plates is 12½ minutes, which is the same as the total processing time for the method of Comparative Example 1. Thus, no additional time is required to take advantage of the savings in developer consumption. Furthermore, the developing station only operates for a total of six minutes, resulting in energy savings as compared to the process of Comparative Example 1.

EXAMPLE 2

The procedure of Example 1 is repeated with the exceptions that the processor conveyor operates at 6 feet per minute, and a total of twelve plates are processed per group, with eight in set "A" and 4 in set "B". The twelve plates are processed in the sequence A-A-B-A-A-B-A-A-B-A-A-B. The order of plate development is 8, 7, 9, 6, 5, 10, 4, 3, 11, 2, 1, 12. The imager operates for a total of 12 minutes. The processor begins operating at 9:00 and accepts 3 plates per minute, each having a total processing time of 90 seconds. The twelfth plate enters the processor at twelve minutes and 40 seconds and exits the processor at 14 minutes and 10 seconds.

Total developer consumption is (30 ml/plate×12 plates)+6 ml+6 ml=372 ml for 12 plates or 31.0 ml per plate.

As will be apparent to persons skilled in the art, various modifications and adaptations of the method and structure above described will become readily apparent without departure from the spirit and scope of the invention, the scope of which is defined in the appended claims.

What is claimed is:

1. A method of processing imaged workpieces for development comprising the steps of:
   (a) obtaining a first set of imaged workpieces directly from an imaging station;
   (b) obtaining a second set of workpieces from an imaged workpiece collection device;
   (c) aligning said workpieces from said first set with said workpieces from said second set in a contiguous arrangement to form a group of contiguous workpieces; and
   (d) applying a developer solution to said group of contiguous workpieces.

2. A method according to claim 1, wherein said workpieces in said first set are continuously conveyed in spaced apart relation from said imaging station to a developing station where developer is applied according to step (d).

3. A method according to claim 1, wherein said workpieces in said second set are interspersed with said workpieces in said first set in step (c).

4. A method according to claim 2, wherein said workpieces in said second set are interspersed with said workpieces in said first set in step (c) and conveyed together as said group to said developing station.

5. A method according to claim 1, wherein said workpieces in said second set are positioned adjacent to said workpieces in said first set in step (c).

6. A method according to claim 2, wherein said imaged workpiece collection device is associated with said imaging station.

7. A method according to claim 1, wherein said imaged workpiece collection device is associated with a supplemental imaging station.

8. A method according to claim 1, wherein said developer solution is applied using a wire-wound coating device.

9. A method according to claim 1, wherein said developer solution is applied using a spraying device.

10. A method according to claim 1, wherein said developer solution is applied using a jetting device.

11. A method according to claim 10, wherein said jetting device includes a stationary jetting printhead.

12. A method according to claim 10, wherein said jetting device includes a movable jetting printhead.

13. A method according to claim 1, wherein said workpieces are rectangular plates.

14. A method according to claim 13, wherein said contiguous group of workpieces includes at least six workpieces.

15. A method according to claim 13, wherein said contiguous group of workpieces includes at least ten workpieces.

16. A method according to claim 4, wherein said workpieces are rectangular plates having leading and trailing edges relative to the direction of conveyance and step (d) of applying developer solution includes applying developer solution outside the leading and trailing edges.

17. A method according to claim 16, wherein for each group of plates the volume of developer applied outside said leading and trailing edges is less than 15% of the developer volume applied to said group.

18. A method according to claim 16, wherein for each group of plates the volume of developer applied outside said leading and trailing edges is less than 10% of the developer volume applied to said group.

19. A method according to claim 1, wherein said workpieces are lithographic printing plates.

20. A method of reducing the quantity of solution required for processing lithographic printing plates in an automated process, comprising the step of contiguously arranging said plates head-to-tail in groups having at least six workpieces per group prior to application of said solution in order to reduce leading and trailing edge losses of said solution.

21. A method according to claim 20, wherein each group of plates includes a first set of plates received directly from an imaging station and a second set of plates received from an imaged plate stockpile.

22. A method according to claim 20, wherein said plates from said second set are interspersed with said plates from said first set.

23. A method of delivering lithographic printing plates to a developing station comprising the steps of:
   (a) obtaining a first set of plates from an imaging station;
   (b) obtaining a second set of plates from an imaged plate stockpile;
   (c) interspersing said plates from said first set with said plates from said second set;
   (d) aligning said interspersed plates in a contiguous arrangement; and (e) conveying said aligned plates to the developing station.

24. A method according to claim 23, wherein said interspersed plates are arranged in groups having at least six plates per group.

25. An apparatus for processing imaged workpieces comprising:
   (a) an imaging station;
   (b) a developing station;
   (c) a workpiece collection device positioned between said imaging station and said developing station for storing imaged workpieces; and
   (d) alignment means positioned between said imaging station and said developing station for aligning workpieces departing from said imaging station with workpieces departing from said workpiece collection device in a contiguous arrangement to form a group of contiguous workpieces, and
   (e) means for conveying said group of contiguous workpieces to said developing station.

26. An apparatus according to claim 25, wherein said alignment means includes means for interspersing workpieces departing from said imaging station with workpieces departing from said workpiece collection device.

27. An apparatus according to claim 25, wherein said developing station includes a wire-wound applicator for applying a developer solution to said workpieces.

28. An apparatus according to claim 27, wherein said wire-wound applicator comprises a horizontal wire-wound tube, a hollow tube positioned above or within said wire-wound tube having a plurality of apertures along the length on one side thereof, and means for feeding said developer solution into said hollow tube whereby said developer solution overflows from said hollow tube through said plurality of apertures and flows down said hollow tube onto said wire-wound tube.

29. An apparatus for delivering lithographic printing plates to a developing station comprising:
   (a) means for receiving a first set of plates from an imaging station;
   (b) collection means for collecting a second set of plates;
   (c) means for interspersing said plates from said first set with said plates from said second set;
   (d) alignment means for aligning said interspersed plates in a contiguous arrangement; and
   (e) means for conveying said aligned plates to the developing station.

30. An apparatus according to claim 29, wherein said collection means is configured to collect said second set of plates from said imaging station.

* * * * *